United States Patent
Tadaki et al.

[11] Patent Number: 5,732,009
[45] Date of Patent: Mar. 24, 1998

[54] SEMICONDUCTOR INTEGRATED CIRCUIT DEVICE INCLUDING A DRAM IN WHICH A CELL SELECTION TRANSISTOR HAS A STABILIZED THRESHOLD VOLTAGE

[75] Inventors: Yoshitaka Tadaki, Hanno; Jun Murata, Kunitachi; Katsuo Yuhara, Ibaraki-ken; Yuji Ezaki, Tsuchiura; Michio Tanaka, Ome; Michio Nishimura, Tokorozawa; Kazuhiko Saitoh, Ibaraki-ken; Takatoshi Kakizaki, Tsukuba; Shinya Nishio, Musashimurayama; Takeshi Sakai, Ome; Songsu Cho, Ibaraki-ken, all of Japan

[73] Assignees: Hitachi, Ltd., Tokyo, Japan; Texas Instruments Incorporated, Dallas, Tex.

[21] Appl. No.: 685,006

[22] Filed: Jul. 22, 1996

[30] Foreign Application Priority Data

Jul. 25, 1995 [JP] Japan ................................. 7-188707

[51] Int. Cl.⁶ ........................................ G11C 5/02
[52] U.S. Cl. .......................... 365/51; 257/296; 257/300
[58] Field of Search ........................ 365/51; 257/300, 257/296, 905, 906, 907

[56] References Cited

U.S. PATENT DOCUMENTS

| | | | |
|---|---|---|---|
| 4,970,564 | 11/1990 | Kimura et al. | 357/23.6 |
| 5,428,239 | 6/1995 | Okumura et al. | 257/371 |
| 5,539,231 | 7/1996 | Suganaga et al. | 257/306 |
| 5,578,849 | 11/1996 | Tadaki et al. | 257/298 |
| 5,610,418 | 3/1997 | Eimori | 257/306 |

FOREIGN PATENT DOCUMENTS

5-291532  11/1993  Japan.

*Primary Examiner*—David C. Nelms
*Assistant Examiner*—Hien Nguyen
*Attorney, Agent, or Firm*—Antonelli, Terry, Stout, & Kraus, LLP

[57] ABSTRACT

A DRAM has memory cells provided at crossing points between word line conductors and bit line conductors. Each memory cell has a cell selection transistor and an information storage capacitor arranged over the bit line conductors. Unit active regions are defined in a main surface of a semiconductor substrate by a field isolation pattern. The field isolation pattern has a controlled length of extension of bird's beaks so that channel formation regions in each unit active region has almost no stepped portion to provide the cell selection transistors with a stabilized threshold voltage.

11 Claims, 12 Drawing Sheets

SEMICONDUCTOR INTEGRATED CIRCUIT DEVICE INCLUDING A DRAM IN WHICH A CELL SELECTION TRANSISTOR HAS A STABILIZED THRESHOLD VOLTAGE

BACKGROUND OF THE INVENTION

The present invention relates in general to a semiconductor integrated circuit device and more particularly to a semiconductor integrated circuit device having a DRAM (Dynamic Random Access Memory).

In recent years, in a large capacity DRAM, for the purpose of compensating for decrease of a storaged charge amount (Cs) of an information storage capacitor resulting from promotion of scale down of a memory cell, there is employed a stacked structure in which the information storage capacitor is arranged over a MISFET for selection of a memory cell.

Out of the memory cells each having the above-mentioned stacked structure, in the memory cell having a COB (Capacitor Over Bitline) structure, in which an information storage capacitor is arranged over a bit line used to write/read information to/from the memory cell, a stepped portion in a low level layer in which a storage node electrode of the information storage capacitor is formed is flattened by the presence of the bit lines. Therefore, that memory cell having the COB structure includes the feature that a burden imposed on the process when forming the information storage capacitor can be reduced. In addition, since the bit line is shielded electromagnetically by the information storage capacitor, that memory cell having the COB structure also includes the feature that a high signal-to-noise (S/N) ratio can be obtained.

In the memory cells of the DRAM, a pair of MISFETs for cell selection having the bit line in common are formed in each active region which is defined on the basis of a pattern of a field insulating film. In addition, a bit line is connected through a first contact hole to a semiconductor region (a first semiconductor region) which is located at a central portion of the active region, and the storage node electrodes of the information storage capacitors are respectively connected through second contact holes to semiconductor regions (second semiconductor regions) which are located at the both ends of the active region.

Now, in the memory cell having the above-mentioned COB structure, after connecting the bit line to the first semiconductor region, the storage node electrodes of the information storage capacitors are respectively connected to the second semiconductor regions. Therefore, if the bit line extends over each of the second semiconductor regions to which the storage node electrodes are respectively connected, then the storage node electrodes can not be connected to the second semiconductor regions, respectively.

Thus, in the memory cell of the COB structure, for example, as shown in FIG. 1, the active region and the associated bit line are made intersect obliquely each other so as for the bit line not to be arranged over the second semiconductor regions to which the storage node electrodes are respectively connected. Incidentally, the memory cell in which the active region and the associated bit line are made intersect obliquely each other is, for example, disclosed in U.S. Pat. No. 4,970,564 to Shinichiro Kimura et al. entitled "SEMICONDUCTOR MEMORY DEVICE HAVING STACKED CAPACITOR CELLS" issued on Nov. 3, 1990.

Referring now to FIG. 1, a plurality of active regions 53 which are surrounded by a field insulating film 52 are arranged on a semiconductor substrate 51. A plurality of word lines WL are arranged in parallel with one another, and a plurality of bit lines BL are arranged in parallel with one another so as to be perpendicular to the word lines WL. Therefore, the active regions 53 are arranged obliquely with respect to both the word lines WL and the bit lines BL. Each of the word lines WL serves as a gate electrode of the associated cell selection MISFET, and a channel region 58 is formed in the active region 53 under the gate electrode through a gate insulating film.

A first contact hole 55 through which the associated bit line BL and a first semiconductor region 54 are connected to each other is formed on and above the first semiconductor region 54 which is located at the central portion of the active region 53. In addition, an information storage capacitor (not shown) is formed on each of second semiconductor regions 56 which are located on both the ends of the active region 53, and also a second contact hole 57 through which a storage node electrode of the information storage capacitor and the active region 53 are connected to each other is formed thereabove.

Now, the field insulating film in the DRAM is normally formed by the LOCOS (Local Oxidation of Silicon) method because of easiness of its formation technique. However, when utilizing the LOCOS method, the area of the active region is decreased due to the beak-like extension of the silicon oxide film called the bird's beak.

In particular, in the memory cell shown in FIG. 1, the area of each of the second semiconductor regions 56, which are located at the both ends of the active region 53, is easy to be remarkably decreased due to the presence of the bird's beak. However, since the both ends of the active region 53 are in close proximity to the respective adjacent active regions 53, the area of each of the second semiconductor regions 56 can not be increased unless the area of the memory cell is increased. For this reason, the second contact holes 57 to be provided on and above the second semiconductor regions 56 may not be readily opened and hence the bad conducting may occur between the storage node electrode of the information storage capacitor and the associated second semiconductor region 56 in some cases. This is a problem associated with the above-mentioned prior art example.

As a method of solving the above-mentioned problem, there is proposed a memory cell of the COB structure having an active region which is called a seagull wing from its external form. This memory cell is described in JP-A-5-291532 (laid open on Nov. 5, 1993), for example. A layout view of the memory cell having an active region of the seagull wing structure is shown in FIG. 2.

That is, as shown in FIG. 2, in the memory cell as well having the active region of the seagull wing structure, a plurality of word lines WL are arranged approximately in parallel with one another, and a plurality of bit lines BL are arranged approximately in parallel with one another so as to extend perpendicular to the word lines WL. But, each of a plurality of active regions 53, which are arranged on a semiconductor substrate 51, has a seagull wing-like figure showing a symmetry between the left and right halves.

A first contact hole 55 is formed on and above a first semiconductor region 54 which is located at the central portion of the active region 53 corresponding to the body of the seagull so as to connect the associated bit line BL and the first semiconductor region 54 to each other. In addition, channel regions 58 of the cell selection MISFETs are located in the active region 53 corresponding to the inner wings of the seagull and second contact holes 57 are respectively formed on and above second semiconductor regions 56 corresponding to the outer wings of the seagull so as to connect the storage node electrodes of the information storage capacitors and the associated second semiconductor regions 56 to each other.

In the memory cell having the active region 53 of the seagull wing structure, since a distance between the active regions 53 adjacent to each other in a direction of extension of the bit lines BL can be sufficiently ensured, a length of each of the outer wings can be increased as required without increasing the area of the memory cell.

Therefore, even if the LOCOS oxide film is employed as the field insulating film 52, the second semiconductor regions 56 can be designed which allows for decrease of the active region 53 due to generation of the bird's beak. Therefore, the storage electrodes of the information storage capacitors can be respectively connected to the second semiconductor regions 56 without generating the bad opening in the second contact holes 57.

SUMMARY OF THE INVENTION

The present inventors find out the following problems in developing a novel memory cell having the active region of the above-mentioned seagull wing structure.

The above-mentioned LOCOS oxide film is normally formed on the basis of the following steps: Firstly, after forming a pad oxide film over a surface of a semiconductor substrate made of monocrystalline silicon, for example, by the thermal oxidation process, a silicon nitride film is deposited over the semiconductor substrate by the CVD (Chemical Vapor Deposition) method. Next, the silicon nitride film is selectively etched away except for the regions, in which active regions are to be provided later, with a photoresist film having a predetermined pattern as a mask, thereby patterning the silicon nitride film.

Next, the semiconductor substrate is subjected to the selective oxidation with the patterned silicon nitride film as a mask, whereby the LOCOS oxide film is formed on the surface, of the semiconductor substrate, of each of the regions in which the silicon nitride film has been selectively removed. Thereafter, after the remaining silicon nitride film has been removed using a hot phosphoric acid solution and then the pad oxide film remaining on the surface of the semiconductor substrate has been etched away using a hydrofluoric acid solution, a gate oxide film and a gate electrode constituting the cell selection MISFET are formed in this order.

However, when carrying out the above-mentioned selective oxidation, as described above, the surface as well of the semiconductor substrate below the patterned silicon nitride film used as a mask is supplied with oxygen, with a result that bird's beaks are formed.

However, when carrying out the above-mentioned selective oxidation with the silicon nitride film pattern having a bent portion as a mask and when the bent portion and its vicinity of the silicon nitride film pattern have an identical width, there occurs a phenomenon that an extension of the bird's beak of the oxide film which is formed under the bent portion and its vicinity is different between the inside and the outside of the bent portion.

As an example, FIG. 3a shows a plan view of a semiconductor substrate 61 and a silicon nitride film pattern having a bent portion, when viewed in a plane of the main surface of the semiconductor substrate 61 with an angle $\theta_A$ at point A on its upper side being 240 degrees, and an angle $\theta_B$ at point B on its lower side being 120 degrees. FIGS. 3b and 3c are cross sectional views, each showing a structure of a main portion of the semiconductor substrate 61 having been subjected to a selective oxidation by use of the silicon nitride pattern film 62, taken along line IIIB—IIIB of FIG. 3a.

A LOCOS oxide film 63 as shown in FIG. 3b is formed on the main surface of the semiconductor substrate 61 right after carrying out the selective oxidation with the patterned silicon nitride film 62 shown in FIG. 3a as a mask. FIG. 3c is a cross sectional view of the main surface of the semiconductor substrate 61 after the silicon nitride film 62 used as the mask is removed using a hot phosphoric acid solution and then the bird's beak 64 of the LOCOS oxide film 63 and a pad oxide film (not shown) which are formed on the surface of the active region are removed in turn using a hydrofluoric acid solution. In addition, in FIG. 4, a region L is shown in the form of an enlarged view.

As shown in FIGS. 3a and 3b, the surface of the semiconductor substrate 61 at a point A having a bend angle of 240 degrees is easy to be supplied with oxygen, and hence the oxidation of the surface of the semiconductor substrate 61 below the silicon nitride film 62 extends from the point A towards a point B. As a result, the extension of the bird's beak becomes large. On the other hand, the surface of the semiconductor substrate 61 at the point B having a bend angle of 120 degrees is harder to be supplied with oxygen as compared with the surface of the semiconductor substrate 61 at the point A having the bend angle of 240 degrees. As a result, the extension of the bird's beak becomes small.

Therefore, as shown in FIG. 3c, when removing both the bird's beak 64 and the pad oxide film after removing the silicon nitride film 62 used as the mask, a stepped portion with about 30 nm height occurs on the surface of the active region in the vicinity of the point A.

As shown in FIG. 4, a depth of the impurity ions, which were implanted through the main surface into the active region in order to adjust a threshold voltage of the cell selection MISFET, is in the range of 10 to 20 nm (range Rp=about 15 nm), and hence the impurity ions may be introduced to a depth smaller than that of the height of the above-mentioned stepped portion. As a result, the depth and concentration of the impurities in the channel region (channel formation channel) 65 of the stepped portion are different from those of the impurities in the channel region of the flat region, and hence a kink appears in the drain current-gate voltage characteristics of the cell selection MISFET so that the threshold voltage of the cell selection MISFET may be fluctuated. One of the causes thereof is that the threshold voltage in the stepped portion becomes lower than that in other portion of the channel region. Incidentally, in FIG. 4, the horizontal direction corresponds to the longitudinal direction of the channel.

The pattern of the silicon nitride film which is used as the mask for the selective oxidation when forming the active region of the seagull structure shown in FIG. 2 is complicated in figure, and the bend angle of 105 degrees is present in the vicinity of the formed channel region. Therefore, the extension of the bird's beak and the figure of the end portion of the LOCOS oxide film are different between the upper sides and the lower sides when viewed with respect to the plane of the channel formation region, and hence the stepped portion as shown in FIG. 4 may be formed in the channel formation region. As a result, in the memory cell having the active region of the seagull wing structure, the distribution of the impurity concentration becomes non-uniform in the channel formation region, and hence the threshold voltage of the cell selection MISFET is varied.

An object of the present invention is to provide the technology by which fluctuation of a threshold voltage of a cell selection transistor can be prevented in a DRAM having memory cells of a COB structure.

According to one aspect of the present invention, a DRAM has memory cells provided at crossing points between word line conductors and bit line conductors. Each memory cell has a cell selection transistor and an information storage capacitor arranged over a bit line conductor. Unit active regions are defined in a main surface of a semiconductor substrate by a field isolation pattern. Each of the unit active regions extends to traverse adjacent two word line conductors to form a pair of memory cells and includes one first semiconductor region and two second semiconductor regions. The first semiconductor region is located between the adjacent two word line conductors and connected to one of the bit line conductors, while the two second semiconductor regions are across different ones of the adjacent two word line conductors from the first semiconductor region, respectively, and located between the one bit line conductor and another bit line conductor adjacent to the one bit line conductor so that channel formation regions are provided between the first semiconductor region and the two second semiconductor regions in the main surface of the semiconductor substrate under the adjacent two word line conductors. Each of the channel formation regions has a width adjacent to the second semiconductor region measured generally perpendicular to the bit line conductors larger than a width adjacent to the first semiconductor region measured in that direction.

Thus, the field isolation pattern has a controlled length of extension of bird's beaks so that channel formation regions in each unit active region has almost no stepped portion to provide the cell selection transistors with a stabilized threshold voltage.

The above and other objects as well as the novel features of the present invention will become clear by the following description of the preferred embodiments of the present invention with reference to the accompanying drawings.

BRIEF DESCRIPTION OF THE DRAWINGS

FIGS. 3a to 3c are respectively schematic views each showing a structure of a main portion of a semiconductor substrate after carrying out selective oxidation with a silicon nitride film having a predetermined pattern as a mask, in which FIG. 3a is a plan view of the main portion of the semiconductor substrate, FIG. 3b is a cross sectional view taken on line IIIB—IIIB of FIG. 3a, and FIG. 3c is a cross sectional view showing a structure of the main portion of the semiconductor substrate after the silicon nitride film used as the mask is removed and then the surface of the semiconductor substrate is selectively etched away using a hydrofluoric acid solution;

DESCRIPTION OF THE PREFERRED EMBODIMENTS

Figure 1:
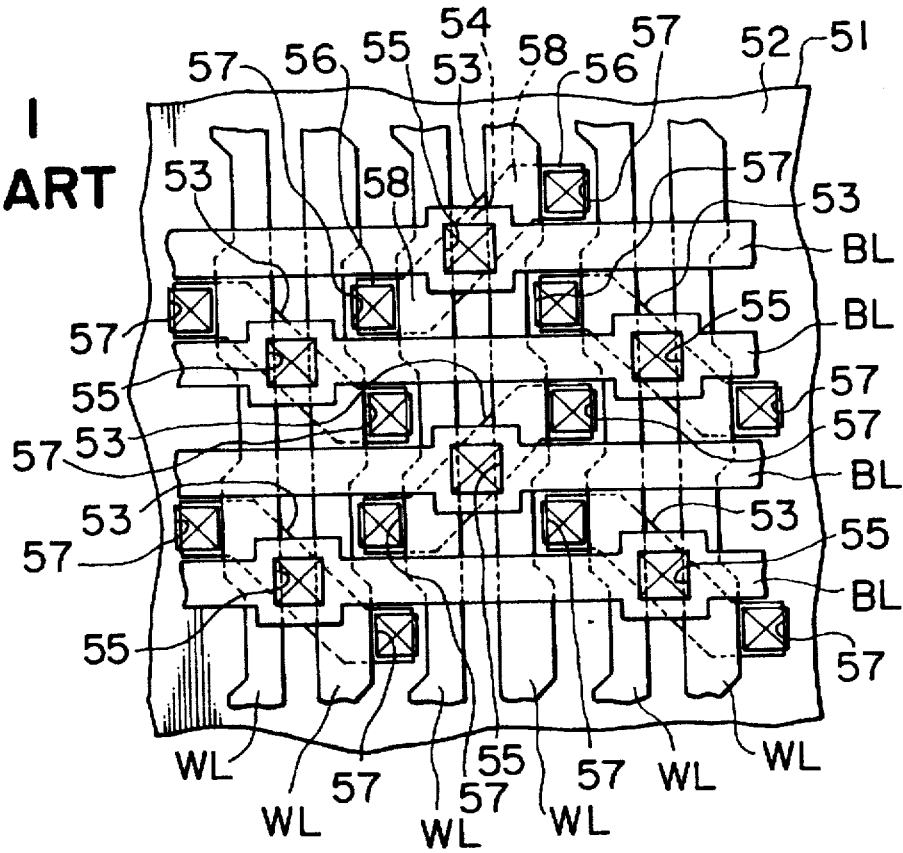
FIG. 1 is a plan view showing layout of a pattern of memory cells each having a COB structure by the prior art.

The preferred embodiments of the present invention will hereinafter be described in detail with reference to the accompanying drawings. Incidentally, in all the drawings useful in explaining the preferred embodiments, elements having the same function are denoted by the same reference numeral, and the repetitive description thereof is omitted for the sake of simplicity.

Figure 5:
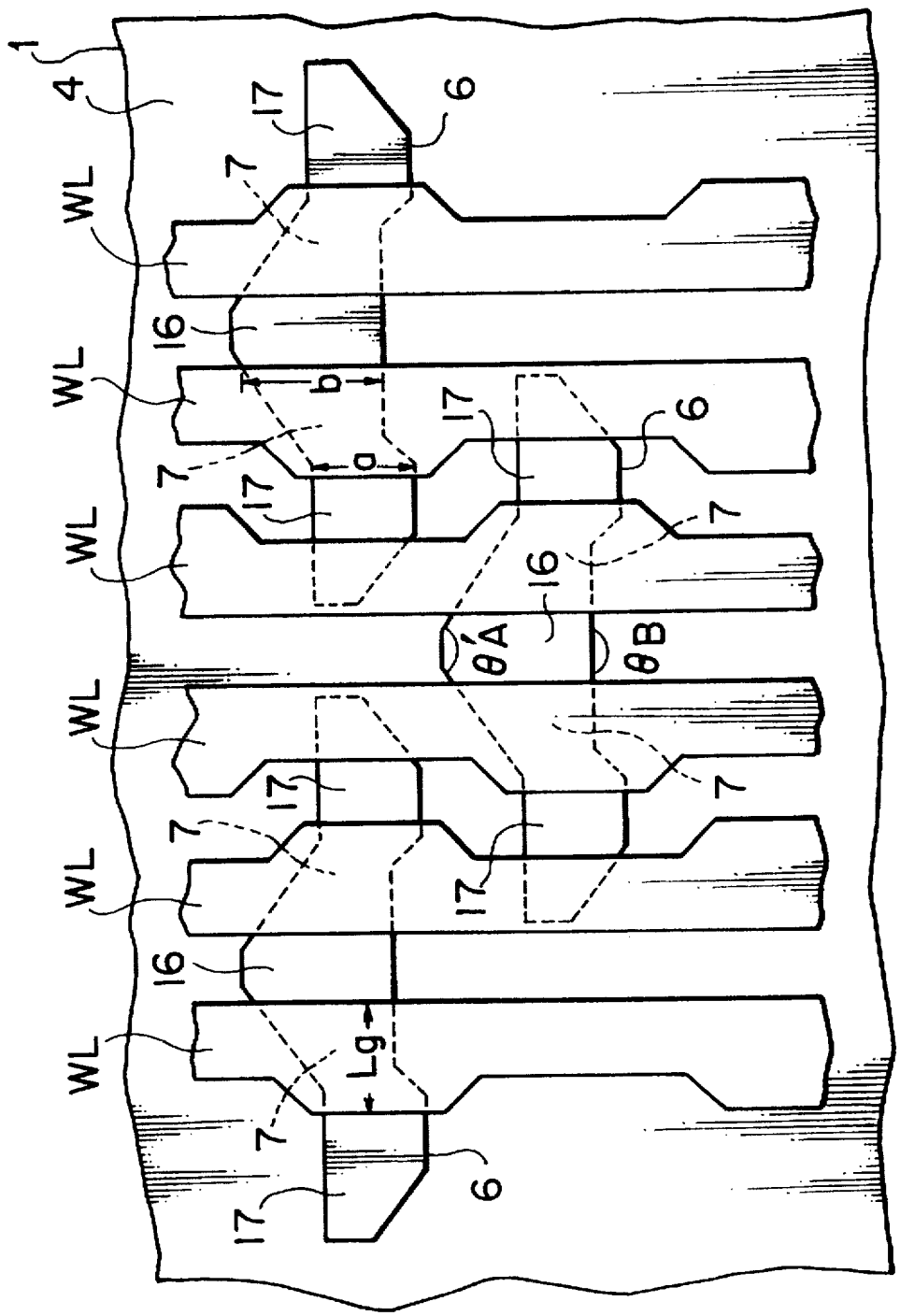
FIG. 5 is a plan view showing layout of a pattern of memory cells of a DRAM according to an embodiment of the present invention.
Figure 6:
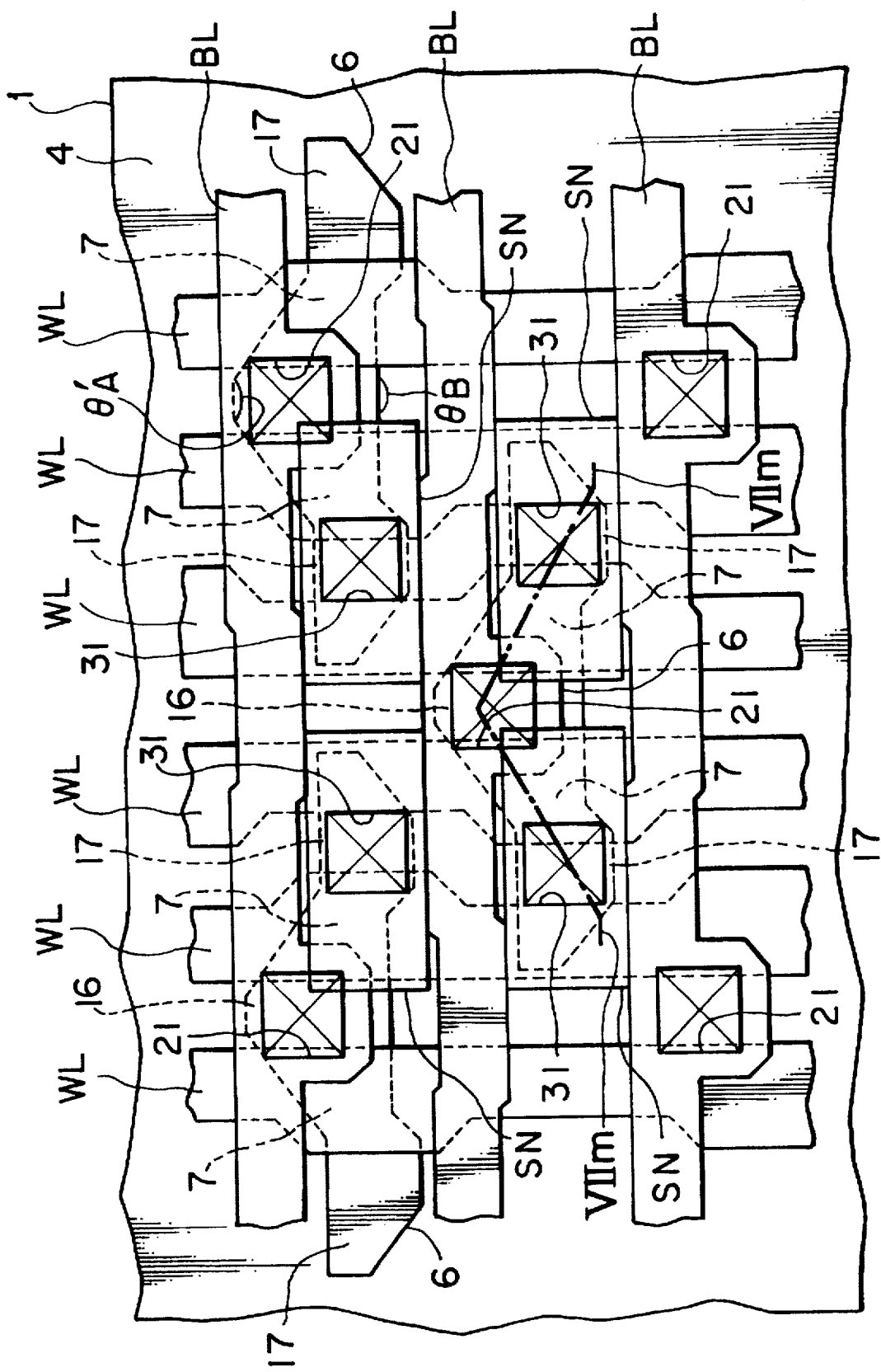
FIG. 6 is a plan view showing in more detail the layout of FIG. 5.

FIGS. 5 and 6 are respectively plan views each showing layout of memory cells of a DRAM according to an embodiment of the present invention.

As shown in FIG. 6, a LOCOS oxide film for element isolation (hereinafter, referred to as "a LOCOS oxide film" for short, when applicable) 4 is formed on a main surface of a semiconductor substrate 1. Each word line conductor WL serving as a gate electrode as well of a MISFET for selection of a memory cell (hereinafter, referred to as "a word line" for short, when applicable) is formed so as to be generally perpendicular to a longitudinal direction of associated unit active regions 6 of a semiconductor substrate 1 which are surrounded by the LOCOS oxide film 4.

One unit active region 6 surrounded by the above-mentioned LOCOS oxide film 4 shows a symmetry between the left and right halves for example. The one unit active region 6 extends longitudinally so as to traverse the associated two word lines. The one unit active region 6 may be divided into a first semiconductor region 16 which is located at a central portion of the active region 6, two second semiconductor regions 17 which are located at both end portions of the unit active region 6, and two channel formation regions 7 which are located between the first semiconductor region 16 and the two second semiconductor regions 17 and below the gate electrodes of the cell selection MISFETs, i.e., the two word lines, respectively. The first semiconductor region 16 is located between the adjacent two word lines WL and is connected to one bit line conductor BL (hereinafter, referred to as "a bit line" for short, when applicable). The two second semiconductor regions 17 are located between the adjacent two bit lines BL.

Each of the word lines WL formed above the associated unit active region 6 has a fixed width Lg which is required for obtaining a threshold voltage of the cell selection MISFET.

Each of the channel formation regions 7 below the associated gate electrode of the cell selection MISFET has a bent portion when viewed with respect to a plane of the main surface. However, the bent portion has an angle larger than 135 degrees for example, and a width a of the edge portion of the channel formation region 7 adjacent to the associated second semiconductor region 17 is smaller than a width b of the edge portion of the channel formation region 7 adjacent to the first semiconductor region 16 to make larger a length of extension of the bird's beak at the lower side than when a=b. Therefore, an upper side and a lower side of the channel formation region 7 have substantially the same length of extension of the bird's beak and substantially the same figure of the end portion of the LOCOS oxide film. Therefore, according to the present embodiment, since the stepped portion is hard to be formed on the surface of the channel formation region of the cell selection MISFET, impurity ions can be introduced to substantially the same depth for the whole surface of the channel formation region, and hence a channel region having a uniform distribution of the impurity concentration can be obtained and also the variation in the threshold voltage of the cell selection MISFET can be prevented.

As shown in FIG. 6, the first semiconductor region 16 is connected to the associated bit line BL as described above through a first contact hole 21 which is formed on the first semiconductor region 16. In addition, each of the second semiconductor regions 17 is connected to a storage node electrode SN of an information storage capacitor through a second contact hole 31 which is formed on the second semiconductor region 17.

Figure 3A:
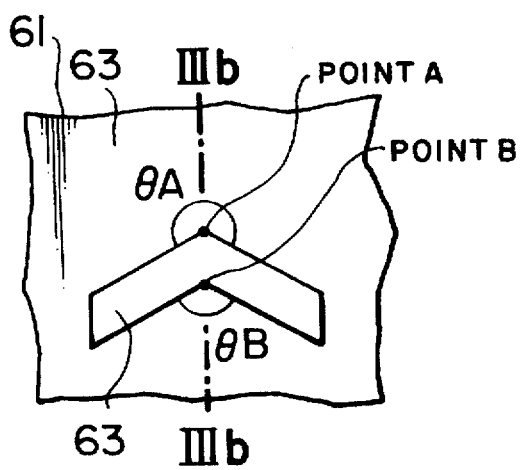
Figure 3B:
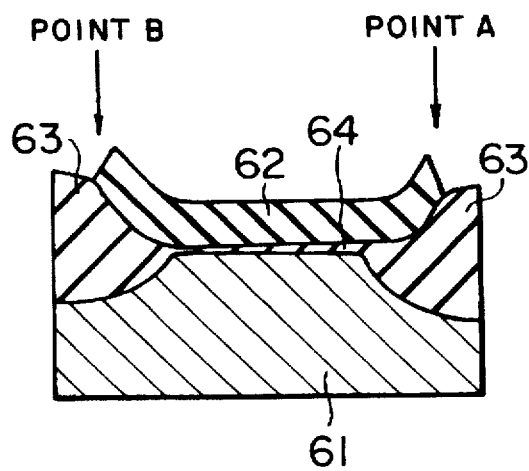
Figure 3C:
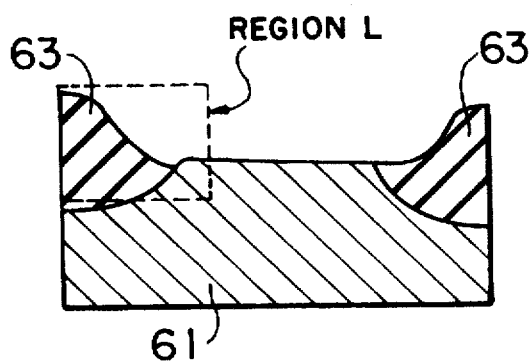
Figure 4:
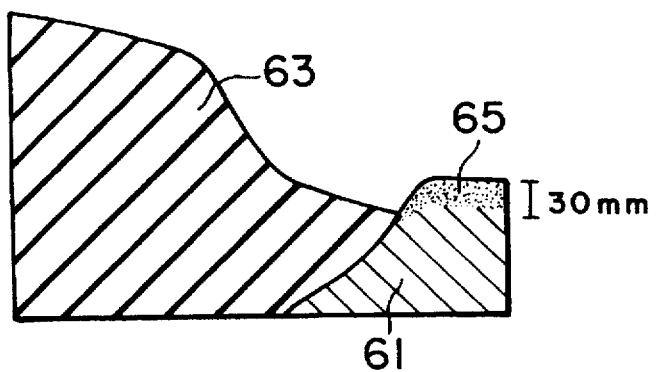
FIG. 4 is an enlarged view of a region L shown in FIG. 3c.

As shown in FIGS. 5 and 6, it is assumed that an angle between upper sides of the central portion of the unit active region 6 is $\theta_A'$, and an angle between lower sides of the central portion of the unit active region 6 is $\theta_B$, so that $\theta_A'=360$ degrees$-\theta_A$. In the present embodiment, $\theta_A'=120$ degrees and $\theta_B=180$ degrees. Incidentally, $\theta_A$ and $\theta_B$ in connection with FIGS. 5 and 6 correspond to $\theta_A$ and $\theta_B$ in connection with in FIG. 3a, respectively.

Now, $\theta_B$ is made larger than $\theta_A'$, whereby a length of extension of a bird's beak of the upper portion in the central portion of the active region 6 can be made close to a length of extension of a bird's beak of the lower portion in the central portion of the active region 6. However, as the side effects, the area of the first semiconductor region 16 connected to the bit line BL is increased and hence the parasitic capacity of the bit line BL may be increased if $\theta_B$ is too much increased.

Figure 2:
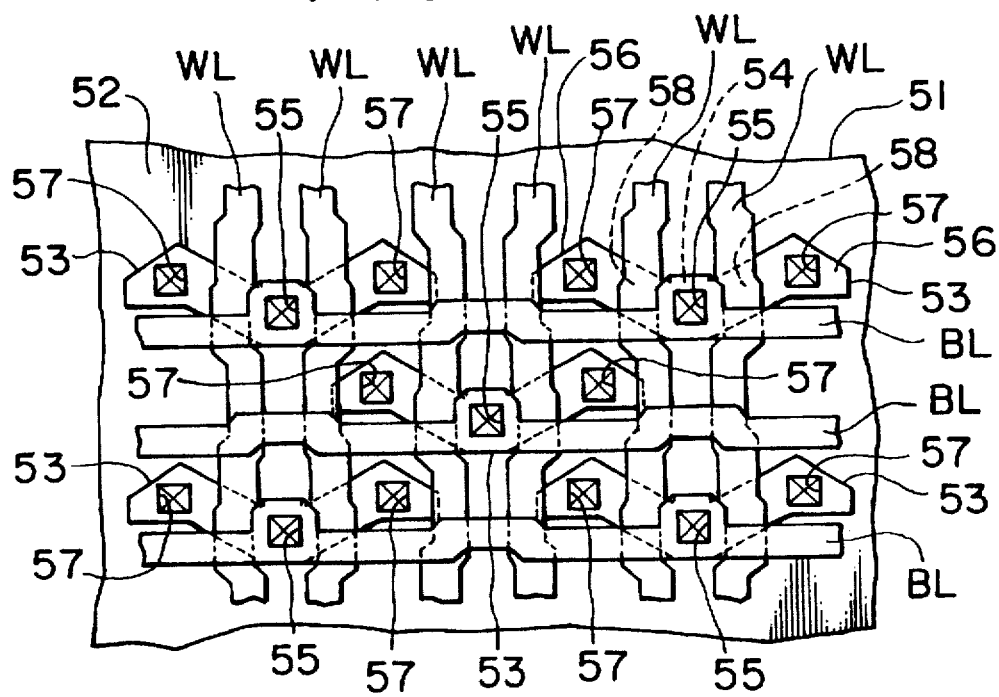
FIG. 2 is a plan view showing layout of a pattern of memory cells each having a COB structure by another prior art.

For example, as shown in FIGS. 1 and 2 in which $\theta_B$ is made larger than 180 degrees, a spacing between the active regions 6 adjacent to each other in the vertical direction when viewed with respect to a plane of the main surface should be made larger than the current spacing.

In other words, it is desirable that $\theta_B$ fulfills the condition of 180 degrees$\geq \theta_B > \theta_A'$.

Each of the bit lines BL is arranged so as to be generally perpendicular to the word lines WL. A central axis line of the bit line is not necessarily made match in position the central portion of the first contact hole 21. In this case, however, the bit line BL should be provided with a projection portion which is used to cover the whole second contact hole 31. Since when providing the bit line BL with the projection portion, there is a possibility that the short-circuit failure may occur between the projection portion of the bit line of interest and the bit line BL adjacent thereto in some cases, the portion of the bit line BL adjacent to the projection portion is slightly curved to form a curved portion so as for that portion of the bit line BL to be apart from the projection portion.

Next, an embodiment of the present invention will hereinbelow be described with reference to FIG. 8.

Figure 8:
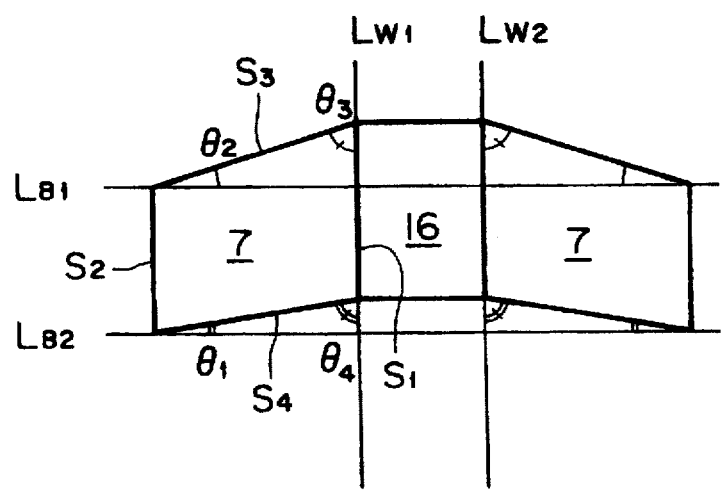
FIG. 8 is a schematic plan view showing a structure of memory cells of a DRAM according to an embodiment of the present invention.

FIG. 8 is a plan view, when viewed in a plane of the main surface of the semiconductor substrate, showing a simplified figure and arrangement of the unit active region 6, mainly the channel formation region 7. In the figure, reference symbols LB1 and LB2 designate a general direction of extension of each of the bit line conductors, and reference symbols Lw1 and Lw2 designate a general direction of extension of each of the word line conductors. Each of the channel formation regions is defined by a first side S1, a second side S2, a third side S3 and a fourth side S4. Incidentally, a and b shown in FIG. 5 correspond to a length of the second side S2 and a length of the first side S1, respectively.

Each of the channel formation regions 7 is defined by a quadrilateral having a first side S1 and a second side S2 which are substantially parallel with a general direction of extension Lw1, Lw2 of the word line conductors WL, and a third side S3 and a fourth side S4 which are arranged in a direction of traversing the sides S1 and S2. The edge portions of the channel formation region corresponding to the side S1 and the side S2 of the quadrilateral 7, respectively, are adjacent to the first and second semiconductor regions 16 and 17, respectively. A part of the edge portion of the channel formation region 7 corresponding to the third side S3 of the quadrilateral 7 is located under one bit line conductor BL to which the first semiconductor region 16 is connected.

A first angle $\theta 1$, a second angle $\theta 2$, a third angle $\theta 3$ and a fourth angle $\theta 4$ of the quadrilateral (channel formation region) 7 are defined as follows.

A first angle $\theta 1$:

an acute angle between the general direction of extension of the bit line conductor BL and the fourth side S4 (a complementary angle of an interior angle between the second side S2 and the fourth side S4).

A second angle $\theta 2$:

an acute angle between the general direction of extension of the bit line conductor BL and the third side S3.

A third angle $\theta 3$:

an interior angle between the first side S1 (i.e., the general direction Lw1 of extension of the word line conductor WL) and the third side S3.

A fourth angle $\theta 4$:

an exterior angle between the first side S1 (i.e., the general direction Lw1 of extension of the word line conductor WL) and the fourth side S4.

In each of the quadrilaterals (channel formation regions) 4, the first angle $\theta 1$ is made smaller than the second angle $\theta 2$, and the third angle $\theta 3$ is made smaller than the fourth angle $\theta 4$.

One or both of the third angle $\theta 3$ and the fourth angle $\theta 4$ is preferably in the range of about 60 degrees to about 90 degrees.

The first angle $\theta 1$ is preferably equal to or smaller than about 30 degrees.

As an example, in each of the quadrilaterals (channel formation regions) 7, the third side S3 may not be parallel with the general direction LB1 of extension of the bit line conductor and also the fourth side S4 may be substantially parallel with the general direction LB2 of extension of the bit line conductor.

According to the above-mentioned embodiment, both the longitudinal sides of the channel formation region 7 in a direction of traversing the word line conductor has substantially the same length of extension of the bird's beak and the same figure of the end portion of the LOCOS oxide film. Therefore, the stepped portion is hard to be formed in the channel formation region, impurity ions can be introduced to substantially the same depth for the whole channel formation region by the ion implantation, and hence it is possible to obtain a channel region having a uniform distribution of the impurity concentration. As a result, no kink appears in the drain current-gate voltage characteristics of the cell selection transistor, and hence it is possible to suppress the variation in the threshold voltage of the cell selection transistor.

Next, the description will hereinbelow be given with respect to a method of manufacturing memory cells of the above-mentioned DRAM with reference to FIGS. 7a to 7m.

Figure 7A:
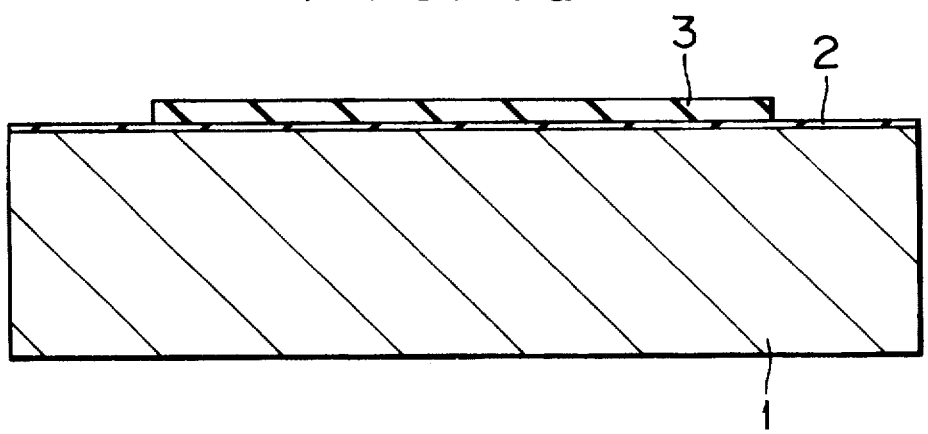
FIGS. 7a to 7m are cross sectional views showing steps of manufacturing process of memory cells of a DRAM according to an embodiment of the present invention.

Firstly, as shown in FIG. 7a, a main surface of a semiconductor substrate 1 made of p⁻ type silicon monocrystal is subjected to the thermal oxidation treatment so as to form a silicon oxide film 2 thereon, and then a silicon nitride film 3 is deposited on the surface of the silicon oxide film 2 by the CVD method. A thickness of the silicon oxide film is 13 nm for example, and a thickness of the silicon nitride film is 140 nm for example.

Figure 7B:
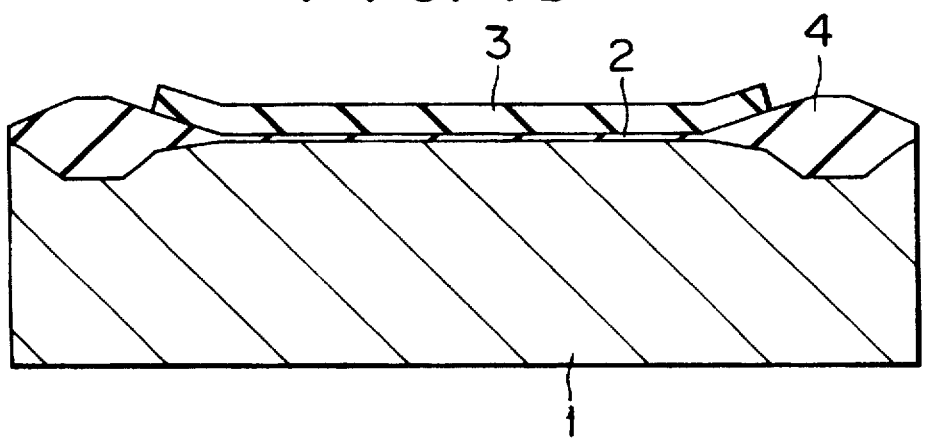

Next, a part of the silicon nitride film 3 located above a part of the surface of the semiconductor substrate 1 in which a LOCOS oxide film 4 will be formed later is etched away with a photoresist film having a predetermined pattern as a mask. Next, after removing the photoresist film, as shown in FIG. 7b, the selective oxidation is carried out with the patterned silicon nitride film 3 as a mask, thereby forming a LOCOS oxide film 4 for element isolation on the main surface of the semiconductor substrate 1. The LOCOS oxide film 4 is formed of a silicon oxide film and its thickness is about 400 nm. Each active region 6 which was described with reference to FIGS. 6 and 8 is defined on the basis of the pattern of the LOCOS oxide film 4. The extension of the bird's beak of the LOCOS oxide film 4 adjacent to each active region 6 and the figure of its vicinity are substantially the same.

Figure 7C:
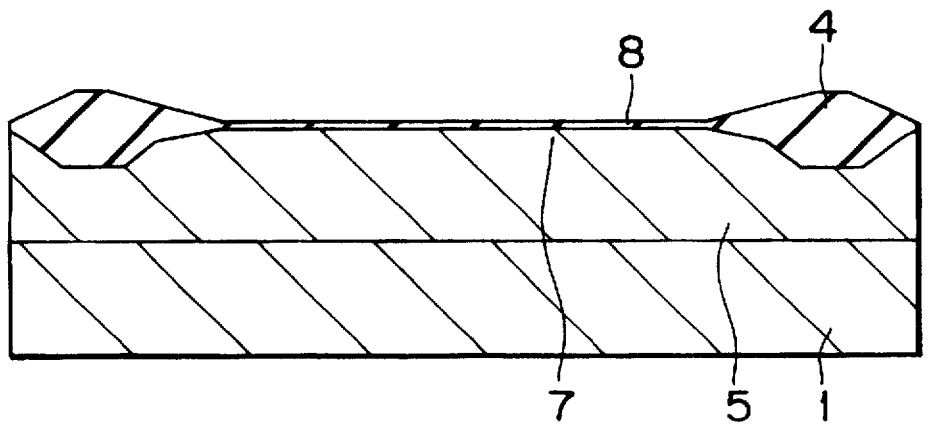

Next, as shown in FIG. 7c, after removing the remaining silicon nitride film 3 using a heat phosphoric acid solution, p type impurity ions (e.g., boron ions) are implanted through the main surface into each region, of the semiconductor substrate 1, in which the memory cell array is to be formed, with a photoresist film having a predetermined pattern as a mask by the ion implantation. Then, after removing the photoresist film, the semiconductor substrate 1 is subjected to the thermal diffusion treatment, thereby forming a p type well region 5.

Next, after selectively etching away the surface of the semiconductor substrate 1 using a hydrofluoric acid solution in order to remove the silicon oxide film 2, a silicon oxide film (not shown) with about 10 nm thickness is formed on the surface of the semiconductor substrate 1. Subsequently, in order to optimize the impurity concentration of a channel formation region 7 to obtain the desired threshold voltage of the MISFET for selection of a memory cell, p type impurity ions (e.g., boron fluoride (BF₂) ions) are implanted through the main surface into the active region of the p type well region 5 by the ion implantation. As described above, since the extension of the bird's beak of the LOCOS oxide film 4 adjacent to each active region 6 and the figure of its vicinity are substantially same, no stepped portion occurs in the channel formation region.

Next, after selectively etching away the surface of the semiconductor substrate 1 using a hydrofluoric acid solution so as to remove the above-mentioned silicon oxide film, a gate insulating film 8 of the cell selection MISFET is formed on the surface of the semiconductor substrate 1. This gate oxide film 8 is formed by the thermal oxidation method and its thickness is about 9 nm.

Figure 7D:
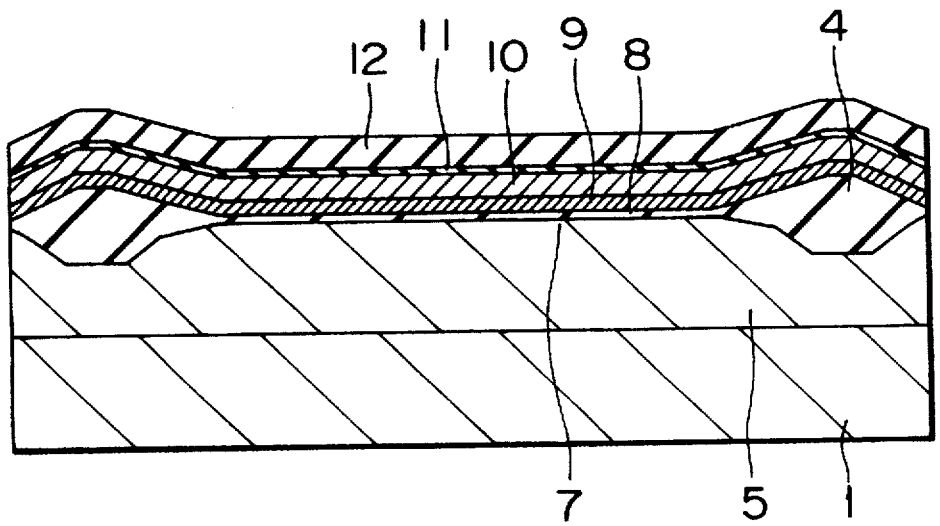

Thereafter, as shown in FIG. 7d, a polycrystalline silicon film 9 containing phosphorus introduced thereinto, and a tungsten silicide (WSi₂) film 10 are deposited in this order on the whole surface of the semiconductor substrate 1. Both the polycrystalline silicon 9 and the WSi₂ film 10 are formed by the CVD method, and their thicknesses are, for example, 70 nm and 150 nm, respectively. Then, an insulating film 11 formed of a silicon oxide film, and a silicon nitride film 12 are deposited in this order on the WSi₂ film 10. Both the insulating film 11 and the silicon nitride film 12 are formed by the CVD method, and their thicknesses are, for example, 10 nm and 200 nm, respectively.

Figure 7E:
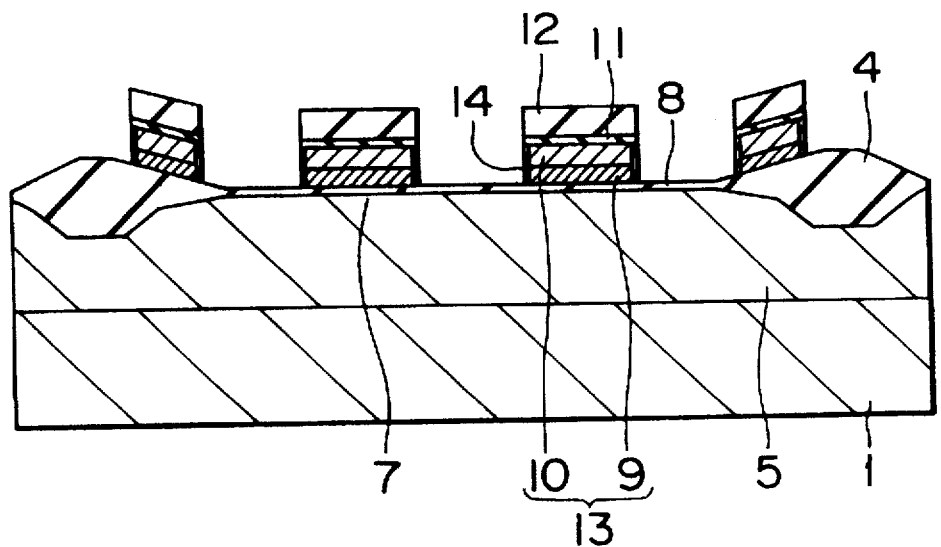

Next, as shown in FIG. 7e, the lamination film consisting of the silicon nitride film 12, the insulating film 11, the WSi₂ film 10 and the polycrystalline silicon film 9 is selectively etched away with a photo resist film having a predetermined pattern as a mask, thereby forming a gate electrode 13 of the cell selection MISFET consisting of the polycrystalline silicon film 9 and the WSi₂ film 10.

Next, after removing the photoresist film, the semiconductor substrate 1 is subjected to the thermal oxidation treatment, thereby forming a thin insulating film formed of a silicon oxide film 14 on both side walls of the polycrystalline silicon film 9 and the WSi₂ film 10 forming the gate electrode 13.

Figure 7F:
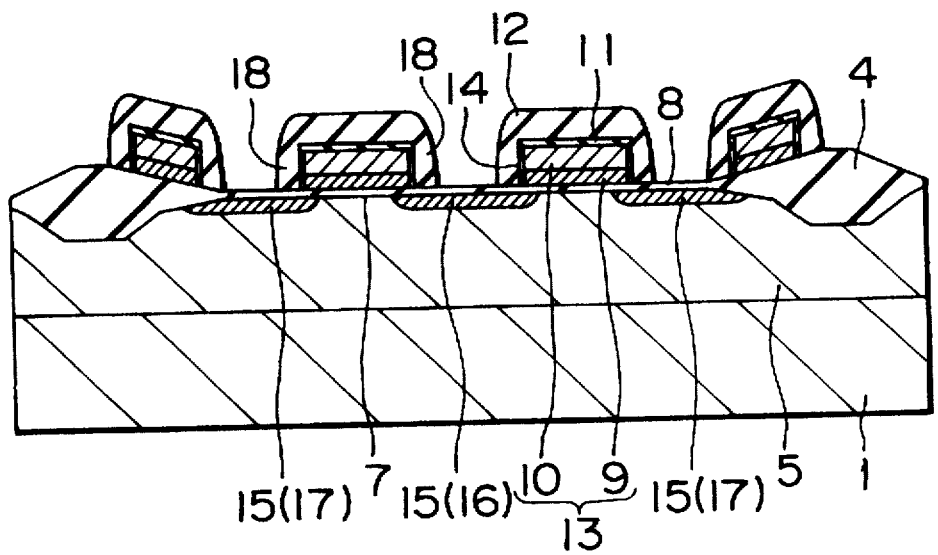

Next, as shown in FIG. 7f, n type impurity ions (e.g., phosphorus ions) are implanted through the main surface into the p type well region 5 with the lamination film (consisting of the films 9, 10, 11, 12 and 14) having the side wall insulating films 14 as a mask. Then, the n type impurities are subjected to the extending diffusion, thereby forming an n type semiconductor region (a source region/a drain region) 15 of the cell selection MISFET.

The n type semiconductor region 15 is divided into a first semiconductor region 16 which is located at the central portion of the active region, and two second semiconductor regions 17 which are located at the both end portions of the active region. One second semiconductor region 17 is arranged across the two channel formation regions 7 of a pair of cell selection MISFETs from the other second semiconductor region 7. In this connection, the bit line BL will be connected later to the first semiconductor region 16, and the storage electrodes SN of the information storage capacitors will be connected later to the second semiconductor regions 17, respectively.

Thereafter, a silicon nitride film (not shown) is deposited on the whole surface of the semiconductor substrate 1 by the CVD method, and then the silicon nitride film is selectively etched away by the anisotropic etching such as the RIE (Reactive ion Etching), thereby forming side wall spacers 18 on both the side walls of the gate electrode 13 of the cell selection MISFET.

Incidentally, both the silicon nitride film 12 overlying the gate electrode 13 of the cell selection MISFET and each side wall spacer 18 formed of the silicon nitride film on each side wall of the gate electrode 13 are provided in order to separate electrically the gate electrode 13 from a conductive layer to be formed thereabove. In addition, the insulating film 11 overlying the gate electrode 13 is provided in order to prevent the chamber for forming a nitride film from being contaminated with tungsten contained as a constituent element in the WSi film 10 constituting the gate electrode 13. The silicon oxide film 14 is provided in order to prevent the gate electrode 13 from coming in contact with each side wall spacer 18 formed of a silicon nitride film.

Alternatively, the source/drain region of the cell selection MISFET may have the LDD (Lightly Doped Drain) structure. In this case, after forming the side wall spacers 18, arsenic ions are more heavily implanted through the main surface into the p type well region 5 as compared with the above-mentioned n type impurity ions.

Figure 7G:
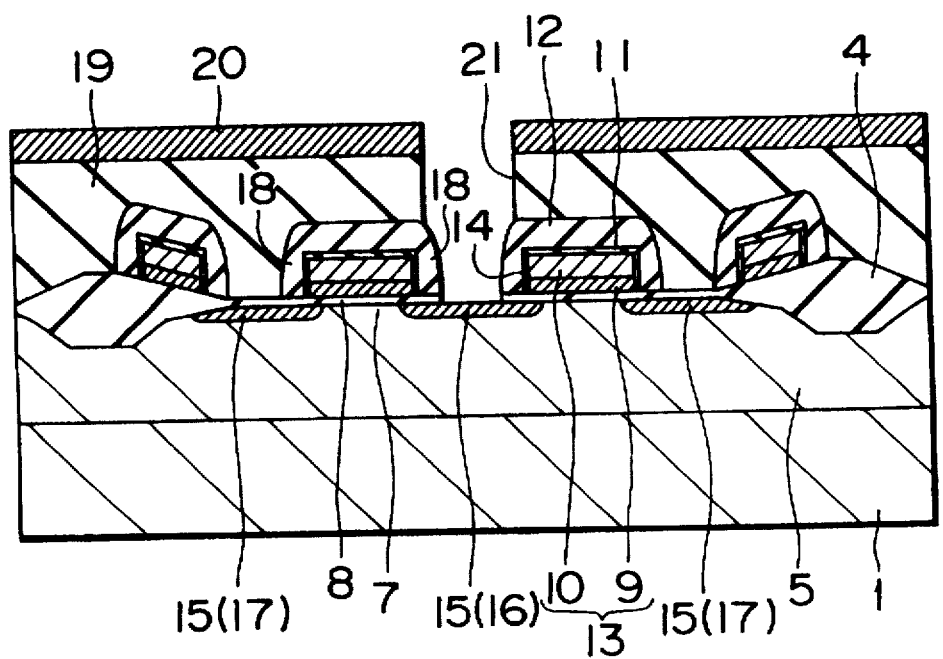

Next, as shown in FIG. 7g, after depositing an insulating film 19 formed of a silicon oxide film over the semiconductor substrate 1 by the CVD method, the surface of the insulating film 19 is flattened by the CMP (Chemical Mechanical Polishing) method for example. Then, a polycrystalline silicon film 20 containing phosphorous introduced thereinto is deposited on the semiconductor substrate 1. Thereafter, the polycrystalline silicon film 20, the insulating film 19 and the insulating film which is at the same level as that of the gate insulating film 8 are selectively etched away in this order with a photoresist film having a predetermined pattern as a mask, whereby a first contact hole 21 is formed on and above the first semiconductor region 16 of the cell selection MISFET.

Figure 7H:
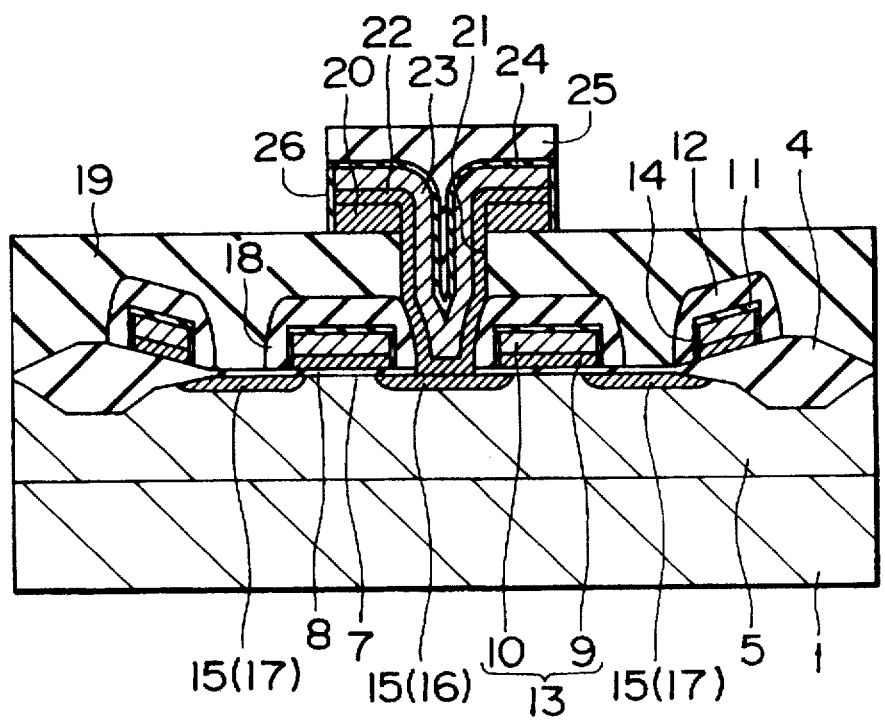

Next, as shown in FIG. 7h, after removing the photo resist film, a polycrystalline silicon film 22 containing phosphorus introduced thereinto and a $WSi_2$ film 23 are deposited in this order on the semiconductor substrate 1 by the CVD method. Subsequently, an insulating film 24 formed of a silicon oxide film and a silicon nitride film 25 are successively deposited on the $WSi_2$ film 23.

Thereafter, the lamination film consisting of the silicon nitride film 25, the insulating film 24, the $WSi_2$ film 23 and the polycrystalline silicon film 22, and the polycrystalline silicon film 20 are selectively etched away in this order with a photoresist film having a predetermined pattern as a mask, thereby forming the bit line BL consisting of the polycrystalline silicon film 20, the polycrystalline silicon film 22 and the $WSi_2$ film 23. The bit line BL is connected through the first contact hole 21 to the first semiconductor region 16 of the cell selection MISFET.

Next, after removing the photo resist film, the semiconductor substrate 1 is subjected to the thermal oxidation treatment, thereby forming a thin silicon oxide film 26 on each of the side walls of the polycrystalline silicon film 20, the polycrystalline silicon film 22 and the $WSi_2$ film 23 forming the bit line BL.

Figure 7I:
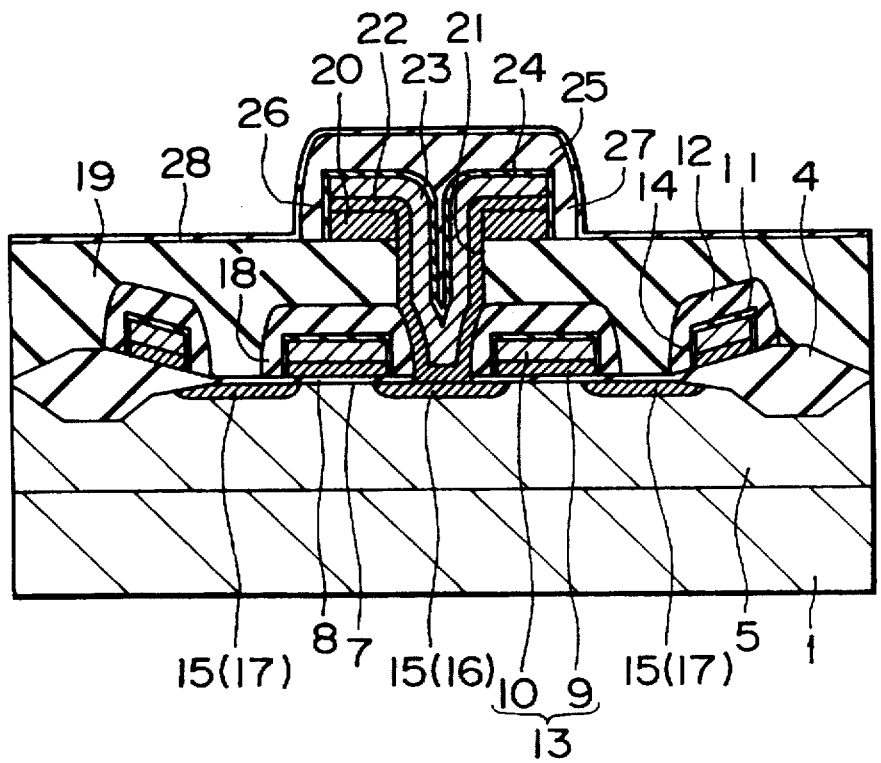

Next, as shown in FIG. 7i, a silicon nitride film (not shown) which has been deposited on the semiconductor substrate 1 is selectively etched away by the anisotropic etching such as the RIE, thereby forming a side wall spacer 27 on each of the side walls of the bit line BL. Thereafter, a silicon nitride film 28 is deposited on the semiconductor substrate 1 by the CVD method.

Incidentally, both the silicon nitride film 25 above the bit line BL, and each side wall spacer 27 formed of a silicon nitride film on each side wall of the bit line BL are provided in order to separate the bit line BL from a conductive layer to be formed thereabove. In addition, the insulating film 24 overlying the bit line BL is provided in order to prevent the chamber for forming a nitride film from being contaminated with tungsten contained as a constituent component in the $WSi_2$ film 23. The silicon oxide film 26 is provided in order to prevent the bit line BL from coming in contact with each side wall spacer 27 formed of a silicon nitride film.

Figure 7J:
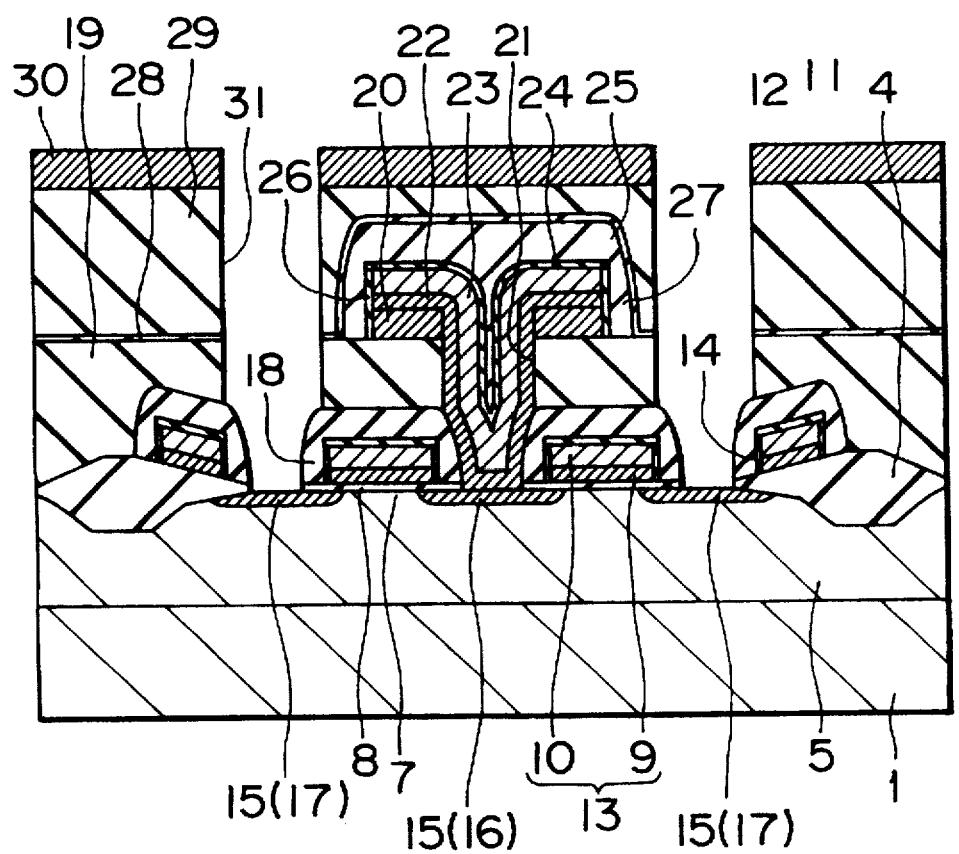

Next, as shown in FIG. 7j, after depositing a silicon oxide film 29 on the semiconductor substrate 1 by the CVD method, the surface of the silicon oxide film 29 is flattened by the CMP method for example, and then a polycrystalline silicon film 30 containing phosphorous introduced thereinto is deposited on the semiconductor substrate 1 by the CVD method.

Next, the polycrystalline silicon film 30, the silicon oxide film 29, the silicon nitride film 28, the insulating film 19 and the insulating film which is at the same level as that of the gate insulating film 8 are selectively etched away in this order with a photoresist film having a predetermined pattern as a mask, thereby forming a second contact hole 31 on and above each of the second semiconductor regions 17 of the cell selection MISFET.

Figure 7K:
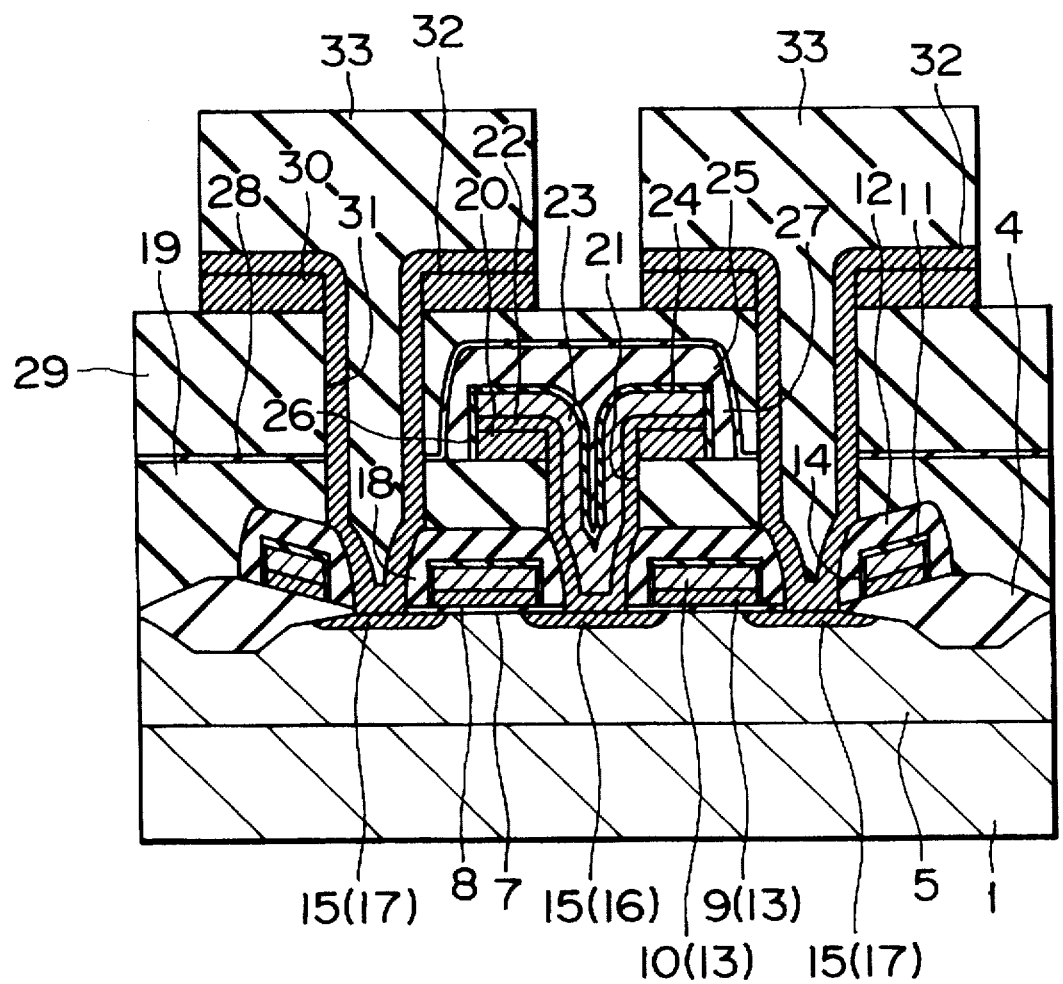

Next, as shown in FIG. 7k, after removing the photo resist film, a polycrystalline silicon film 32 containing phosphorous introduced thereinto and a silicon oxide film 33 are deposited in this order on the semiconductor substrate 1 by the CVD method. The polycrystalline silicon film 32 is also deposited within the second contact hole 31 so as to come in contact with the associated second semiconductor region 17 of the cell selection MISFET.

Subsequently, after flattening the surface of the silicon oxide film 33 by the CMP method for example, with a photoresist film having a predetermined pattern as a mask, the silicon oxide film 33 is selectively etched away and then the polycrystalline silicon film 32 and the polycrystalline silicon film 30 are selectively etched away in turn. Both the polycrystalline silicon film 30 and the polycrystalline silicon film 32 thus processed constitute a part of the storage electrode SN of the information storage capacitor.

Figure 7L:
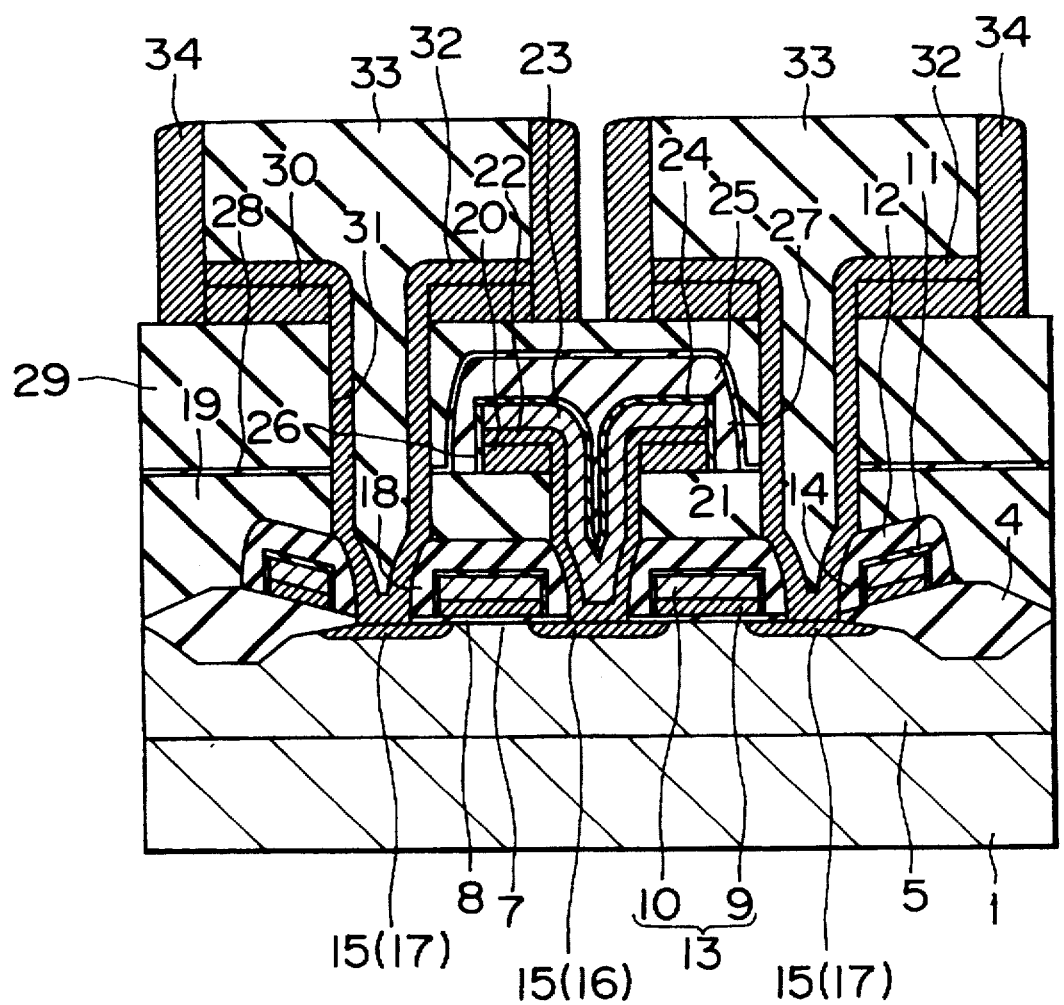

Next, after removing the photo resist film, as shown in FIG. 7l, a polycrystalline silicon film 34 is deposited on the semiconductor substrate 1 by the CVD method. Subsequently, the polycrystalline silicon film 34 is selectively etched away by the anisotropic etching such as the RIE so as to leave a part of the polycrystalline silicon film 34, constituting a part of the storage electrode SN, on each side wall of the polycrystalline silicon film 30, the polycrystalline silicon film 32 and the silicon oxide film 33.

Figure 7M:
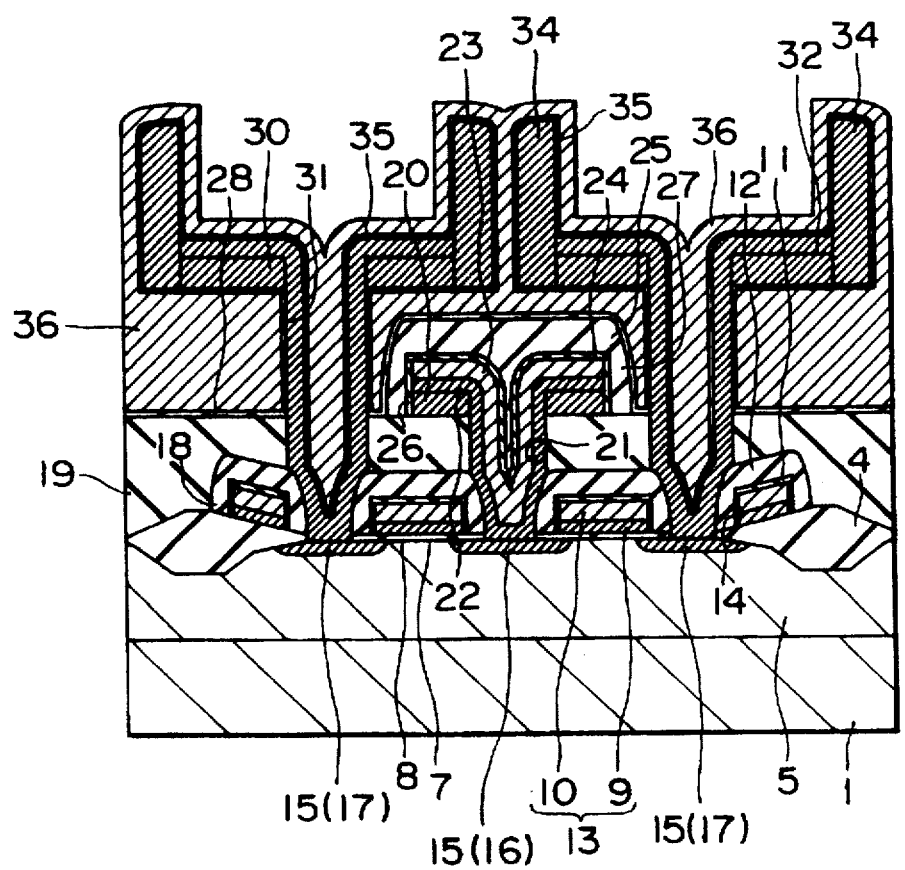

Next, as shown in FIG. 7m, both the silicon oxide film 33 and the silicon oxide film 29 are removed by the wet etching using a hydrofluoric acid solution for example, thereby forming a cylindrical storage electrode SN consisting of the polycrystalline silicon film 30, the polycrystalline silicon film 32 and the polycrystalline silicon film 34.

Next, a silicon nitride film (not shown) is deposited on the semiconductor substrate 1 by the CVD method, and then is subjected to the oxidation treatment, thereby forming a Silicon oxide film on the whole surface of the silicon nitride film to form a dielectric film 35 consisting of the silicon oxide film and the silicon nitride film on the storage electrode SN. Thereafter, a polycrystalline silicon film (not shown) is deposited on the semiconductor substrate 1 by the CVD method, and this polycrystalline silicon film is selectively etched away with a photo resist film having a predetermined pattern as a mask, thereby forming a plate electrode 36.

Next, an interlayer insulating film (not shown) is deposited on the semiconductor substrate 1, and then the surface of the interlayer insulating film is flattened by the CMP method for example. Thereafter, in order to form contact holes (not shown) through which metallic wiring, which will be formed later, and the bit lines BL of the memory cell array are connected to one another, the interlayer insulating film is selectively etched away with a photo resist film having a predetermined pattern as a mask.

Next, after depositing a metallic film (not shown) formed of an aluminium alloy film or a $WSi_2$ film on the semiconductor substrate 1, this metallic film is selectively etched away with a photoresist film having a predetermined pattern as a mask, thereby forming the above-mentioned metallic wiring. Finally, the surface of the semiconductor substrate 1 is covered with a passivation film (not shown), whereby the memory cells of the DRAM of the present embodiment is completed. Incidentally, FIG. 7n shows the same structure as that of the cross sectional view taken on line VIIN—VIIN of FIG. 6.

While the invention made by the present inventors has been concretely described with respect to the preferred embodiments, it is to be understood that the present invention is not limited to the preferred embodiments, and various changes and modifications may be made by one skilled in the art without departing from the subject matter of the invention.

For example, while the above-mentioned embodiment, the description has been given with respect to a method of manufacturing the memory cells of the DRAM employing the cylindrical storage electrode for the information storage capacitor, the present invention is not limited to the memory cell having the information storage capacitor employing the cylindrical storage electrode, and hence the present invention may also be applied to the memory cell employing the storage electrode of a fin type or a simple piled-up type.

In addition, while in the above-mentioned embodiment, the description has been given with respect to a method of manufacturing the memory cells each having the COB structure in which the information storage capacitors are arranged over the bit lines, the present invention may also be applied to the memory cells in which the bit lines are arranged over the information storage capacitors.

Further, while in the above-mentioned embodiment, the two layer film consisting of the silicon oxide film and the silicon nitride film was employed for the dielectric film of the information storage capacitor, the present invention is not limited thereto. That is, for the dielectric film of the information storage capacitor, a high dielectric film such as a tantalum oxide film or a PZT (PbZrTiOx) film, or a lamination film consisting of those films may be employed.

As set forth hereinabove, according to the above-mentioned embodiments of the present invention, since the uniform distribution of the impurity concentration can be obtained in the channel region below the gate electrode of the MISFET for memory cell selection, it is possible to prevent variation in the threshold voltage of the MISFET for memory cell selection.

We claim:

1. A DRAM (dynamic random access memory) comprising a plurality of bit line conductors arranged substantially in parallel with each other, a plurality of word line conductors arranged substantially in parallel with each other and substantially perpendicular to said bit line conductors, memory cells each formed at a crossing point between one of said bit line conductors and one of said word line conductors, and a plurality of unit active regions defined in a main surface of a semiconductor substrate by a pattern of an isolation material, wherein:

each of said unit active regions extends to traverse adjacent two word line conductors to form a pair of memory cells and includes one first semiconductor region and two second semiconductor regions, said first semiconductor region being located between said adjacent two word line conductors and connected to one of said bit line conductors, said two second semiconductor regions being across different ones of said adjacent two word line conductors from said first semiconductor region, respectively, and located between said one bit line conductor and another bit line conductor adjacent to said one bit line conductor so that channel formation regions are provided between said first semiconductor region and said two semiconductor regions in said main surface of said semiconductor substrate under said adjacent two word line conductors; and each of said channel formation regions has a width adjacent to said second semiconductor region measured generally perpendicular to said bit line conductors larger than a width adjacent to said first semiconductor region measured in said direction.

2. A DRAM according to claim 1, wherein each of said memory cells has an information storage capacitor arranged over said bit line conductors, and each of said second semiconductor regions is in contact with a conductive material filling a contact hole to said second semiconductor region, said conductive material serving as a storage node electrode of said information storage capacitor.

3. A DRAM according to claim 1, wherein each of said channel formation areas has, as seen on a plane of said main surface of said semiconductor substrate, opposing first and second sides substantially parallel with said word line conductors and opposing third and fourth sides in a direction transverse thereto, edges of said each channel formation region corresponding to said opposing first and second sides being adjacent to said first and second semiconductor regions, respectively, an edge of said each channel formation region corresponding to said third side being partly located under said one bit line conductor to which said first semiconductor region is connected, and in each of said channel formation areas, an acute angle between a general direction of extension of said bit line conductors and said fourth side is smaller than an acute angle between said general direction of extension of said bit line conductors and said third side, and an interior angle between said first and third sides is smaller than an exterior angle between said first and fourth sides.

4. A DRAM according to claim 3, wherein at least one of said interior angle between said first and third sides and said exterior angle is between about 60 degrees and 90 degrees.

5. A DRAM according to claim 3, wherein said acute angle between said general direction of extension of said bit line conductors and said fourth side is about 30 degrees or smaller.

6. A DRAM comprising a plurality of bit line conductors arranged substantially in parallel with each other, a plurality of word line conductors arranged substantially in parallel with each other and substantially perpendicular to said bit line conductors, memory cells each formed at a crossing point between one of said bit line conductors and one of said word line conductors, and a plurality of unit active regions defined in a main surface of a semiconductor substrate by a pattern of an isolation material, wherein:

each of said unit active regions extends to traverse adjacent two word line conductors and includes one first semiconductor region and two second semiconductor regions, said first semiconductor region being located between said adjacent two word line conductors and connected to one of said bit line conductors, said two second semiconductor regions being across different ones of said adjacent two word line conductors from said first semiconductor region, respectively, and located between said one bit line conductor and another bit line conductor adjacent to said one bit line conductor so that channel formation regions are provided between said first semiconductor region and said two semiconductor regions in said main surface of said semiconductor substrate under said adjacent two word line conductors, said first and second semiconductor regions and said adjacent two word line conductors forming cell selection transistors; and each of said channel formation regions has a width adjacent to said second semiconductor region measured generally perpendicular to said bit line conductors larger than a width adjacent to said first semiconductor region measured in said direction to stabilize threshold voltages of said cell selection transistors.

7. A DRAM according to claim 1, wherein said pattern of an isolation material is a pattern of a field oxide.

8. A semiconductor device including a DRAM as defined in claim 1.

9. A semiconductor device including a DRAM as defined in claim 3.

10. A semiconductor device including a DRAM as defined in claim 5.

11. A semiconductor device including a DRAM as defined in claim 6.

* * * * *

UNITED STATES PATENT AND TRADEMARK OFFICE
CERTIFICATE OF CORRECTION

PATENT NO.   :   5,732,009
DATED        :   March 24, 1998
INVENTOR(S)  :   Y. TADAKI et al.

It is certified that error appears in the above-indentified patent and that said Letters Patent is hereby corrected as shown below:

In column 5, line 28, before "generally" insert -- in a direction --;
         line 29, change "larger" to -- smaller --.

In column 13, cancel the entire last paragraph of claim 1 from lines 57 to 61, and insert the following new last paragraph:

-- each of said channel formation regions has a width adjacent to said second semiconductor region measured in a direction generally perpendicular to said bit line conductors smaller than a width adjacent to said first semiconductor region measured in said direction. --

In column 14, cancel the entire last paragraph of claim 6 from lines 52 to 57, and insert the following new last paragraph:

-- each of said channel formation regions has a width adjacent to said second semiconductor region measured in a direction generally perpendicular to said bit line        conductors smaller than a width adjacent to said first semiconductor region measured in said direction to stabilize threshold voltages of said cell selection transistors. --

Signed and Sealed this

Eleventh Day of August 1998

Attest:

BRUCE LEHMAN

*Attesting Officer*          *Commissioner of Patents and Trademarks*